United States Patent
Lin et al.

(10) Patent No.: US 8,576,653 B2
(45) Date of Patent: Nov. 5, 2013

(54) HIDDEN REFRESH METHOD AND OPERATING METHOD FOR PSEUDO SRAM

(75) Inventors: Shih-Chin Lin, Hsinchu County (TW); Pei-Geng Ma, Hsinchu County (TW); Yen-Hsueh Huang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 250 days.

(21) Appl. No.: 13/175,437

(22) Filed: Jul. 1, 2011

(65) Prior Publication Data
US 2013/0003481 A1 Jan. 3, 2013

(51) Int. Cl.
*G11C 7/00* (2006.01)

(52) U.S. Cl.
USPC .............. 365/222; 365/154; 365/156

(58) Field of Classification Search
USPC .......................... 365/222, 154, 156
See application file for complete search history.

(56) References Cited

U.S. PATENT DOCUMENTS

| | | | |
|---|---|---|---|
| 6,285,578 B1 | 9/2001 | Huang | |
| 6,427,226 B1 | 7/2002 | Mallick et al. | |
| 6,625,077 B2 | 9/2003 | Chen | |
| 6,653,868 B2 | 11/2003 | Oodaira et al. | |
| 6,668,358 B2 | 12/2003 | Friend et al. | |
| 6,813,211 B2 | 11/2004 | Takatsuka et al. | |
| 6,847,572 B2 | 1/2005 | Lee et al. | |
| 2008/0031069 A1* | 2/2008 | Shu et al. | 365/222 |
| 2008/0189662 A1 | 8/2008 | Nandy et al. | |
| 2010/0271895 A1* | 10/2010 | Wang | 365/222 |

OTHER PUBLICATIONS

Hong-Yi Huang, Tzu-Sung Yen; A Low-Voltage Loadless 4N SRAM with Smart Hidden Refresh; Department of Electronic Engineering; Fu-Jen Catholic University, Taiwan; 2003 IEEE; pp. 251-252.
Hong-Yi Huang, Hsuan-Yi Su; Low-Power 2P2N SRAM With Column Hidden Refresh; Department of Electronic Engineering; Fu-Jen University Taiwan; 2002 IEEE; pp. IV-591-IV-594.

* cited by examiner

*Primary Examiner* — Toan Le
(74) *Attorney, Agent, or Firm* — WPAT, PC; Justin King

(57) ABSTRACT

In an exemplary hidden refresh method for a pseudo SRAM, a system clock is received. A duty-on period of the system clock signal is adapted for performing a data access operation such as write or read operation. A refresh clock signal subjected to the control of the system clock signal is generated. A duty-on period of the refresh clock signal is non-overlapped with the duty-on period of the system clock signal. A refresh control pulse then is triggered by a starting edge of the duty-on period of the refresh clock signal to activate a word line, for performing a refresh operation.

20 Claims, 2 Drawing Sheets

HIDDEN REFRESH METHOD AND OPERATING METHOD FOR PSEUDO SRAM

TECHNICAL FIELD

The present invention generally relates to the field of semiconductor integrated circuit random access memory devices, and more particularly to a hidden refresh method and an operating method for a pseudo static random access memory.

BACKGROUND

Memory plays an indispensable role in computer industries. Usually, a traditional memory is classified into a dynamic random access memory (DRAM) or a static random access memory (SRAM) according to its data storage capability. DRAM is advantageous for its small size, but requires periodic refresh to prevent data loss due to current leakage. SRAM is advantageous for its simple operations, but occupies a large chip area.

In order to combine the advantages of both DRAM and SRAM, a pseudo SRAM consisted of a DRAM macro core with a traditional SRAM interface has been proposed. In the pseudo SRAM, an on-chip refresh circuit that frees the user from the need to take care of refresh task. Compared with traditional CMOS SRAM, pseudo SRAM has advantage in higher density, higher speed, smaller die size and DRAM compatible process.

Nowadays, various types of hidden refresh methods for pseudo SRAM have been proposed and also have respective advantages and disadvantages. Therefore, there still is a need to provide a new refresh strategy for pseudo SRAM.

SUMMARY OF EMBODIMENTS

A hidden refresh method for a pseudo SRAM in accordance with an exemplary embodiment includes the following steps of: receiving a system clock signal, a duty-on period of the system clock signal being adapted to perform a data access operation (such as write operation or read operation); generating a refresh clock signal subjected to the control of the system clock signal, a duty-on period of the refresh clock signal being non-overlapped with the duty-on period of the system clock signal; and triggering a refresh control pulse by a starting edge of the duty-on period of the refresh clock signal to activate a word line, for performing a refresh operation.

In one embodiment, the hidden refresh method may further include a step of: triggering a sense amplifier enable pulse by a starting edge of the refresh control pulse to activate a sense amplifier, for performing the refresh operation. Moreover, the ending edge of the refresh control pulse is advantageously prior to the ending edge of the sense amplifier enable pulse.

An operating method for a pseudo SRAM in accordance with another exemplary embodiment includes the following steps of: activating a first word line subjected to the control of a system clock signal cooperative with a data access enable signal (e.g., write enable signal or read enable signal) to perform a data access operation; generating a refresh clock pulse non-overlapping with any clock pulse of the system clock signal, immediately following the data access operation; triggering a first refresh control pulse by a starting edge of the refresh clock pulse to activate a second word line, for performing a refresh operation; and generating a second refresh control pulse after the starting edge of the first refresh control pulse to activate a sense amplifier, for performing the refresh operation.

In one embodiment, in the operating method, the generating of the refresh clock pulse is triggered by an ending edge of a clock pulse of the system clock signal.

In one embodiment, in the operating method, the generating of the second refresh control pulse is triggered by the starting edge of the first refresh control pulse.

A hidden refresh method in accordance with still another exemplary embodiment includes the following steps of: periodically generating a refresh clock pulse triggered by an ending edge of a duty-on period of a system clock signal; and performing a refresh operation row by row subjected to the triggering of the periodically-generated refresh clock pulses.

As described in the above exemplary embodiments, owing to the duty-on period of the refresh clock signal being non-overlapped with the duty-on period of the system clock signal (i.e., generally the refresh clock pulse of the refresh clock signal is non-overlapped with the system clock pulse of the system clock signal), the refresh operation can be hidden in every clock cycle of the system clock signal so as to faithfully emulate an SRAM-type interface and thus could operate without interfere the normal data access operation such as write operation or read operation.

BRIEF DESCRIPTION OF THE DRAWINGS

The above objectives and advantages of the disclosure will become more readily apparent to those ordinarily skilled in the art after reviewing the following detailed description and accompanying drawings.

DETAILED DESCRIPTION OF PREFERRED EMBODIMENTS

An objective of the disclosure is to provide a hidden refresh method and an operating method for a pseudo SRAM. Hereinafter, the disclosure will now be described more specifically with reference to the following embodiments. It is to be noted that the following descriptions of preferred embodiments are presented herein for purpose of illustration and description only. It is not intended to be exhaustive or to be limited to the precise form disclosed.

Figure 1:
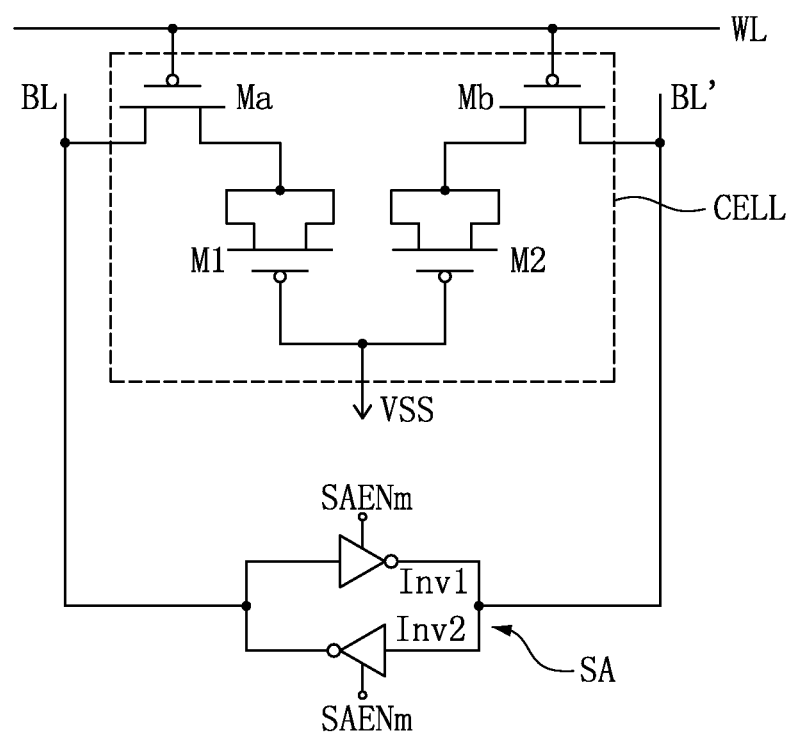
FIG. 1 is a schematic circuit diagram of a 4T memory cell of pseudo SRAM in accordance with an exemplary embodiment.

FIG. 1 is a schematic circuit diagram of a 4T memory cell of a pseudo SRAM in accordance with an exemplary embodiment. As depicted in FIG. 1, the 4T memory cell for example includes four PMOS transistors Ma, Mb, M1 and M2. The PMOS transistors Ma, Mb serve as access transistors, and the PMOS transistors M1, M2 serve as storage transistors for storing data. In detail, the gates of the access transistors Ma, Mb are electrically coupled to a word line WL, and the sources of the access transistors Ma, Mb are respectively electrically coupled to a pair of bit lines BL/BL'. The gates of the storage transistors M1, M2 are electrically coupled to a negative source voltage VSS, the drain and source of the storage transistor M1 both are electrically coupled to the drain of the access transistor Ma, and the drain and source of the storage transistor M2 both are electrically coupled to the drain of the access transistor Mb.

Moreover, as seen from FIG. 1, the transistors Ma, M1 are arranged in twin manner with respect to the transistors Mb, M2, and thus the four transistors cooperatively constitute a twin cell. In addition, it is understood that the fourth PMOS transistors Ma, Mb, M1, M2 all can be replaced by NMOS transistors, and in this situation, the gates of the storage transistors M1, M2 correspondingly are electrically coupled to a positive source voltage instead. In other embodiment, some of the fourth PMOS transistors Ma, Mb, M1, M2 can be replaced by NMOS transistors.

Still referring to FIG. 1, the pair of bit lines BL/BL' are electrically coupled to a sense amplifier SA. In the exemplary embodiment, the sense amplifier SA for example includes a pair of inverters Inv1, Inv2 and is subjected to the control of a sense amplifier enable signal SAENm.

Figure 2:
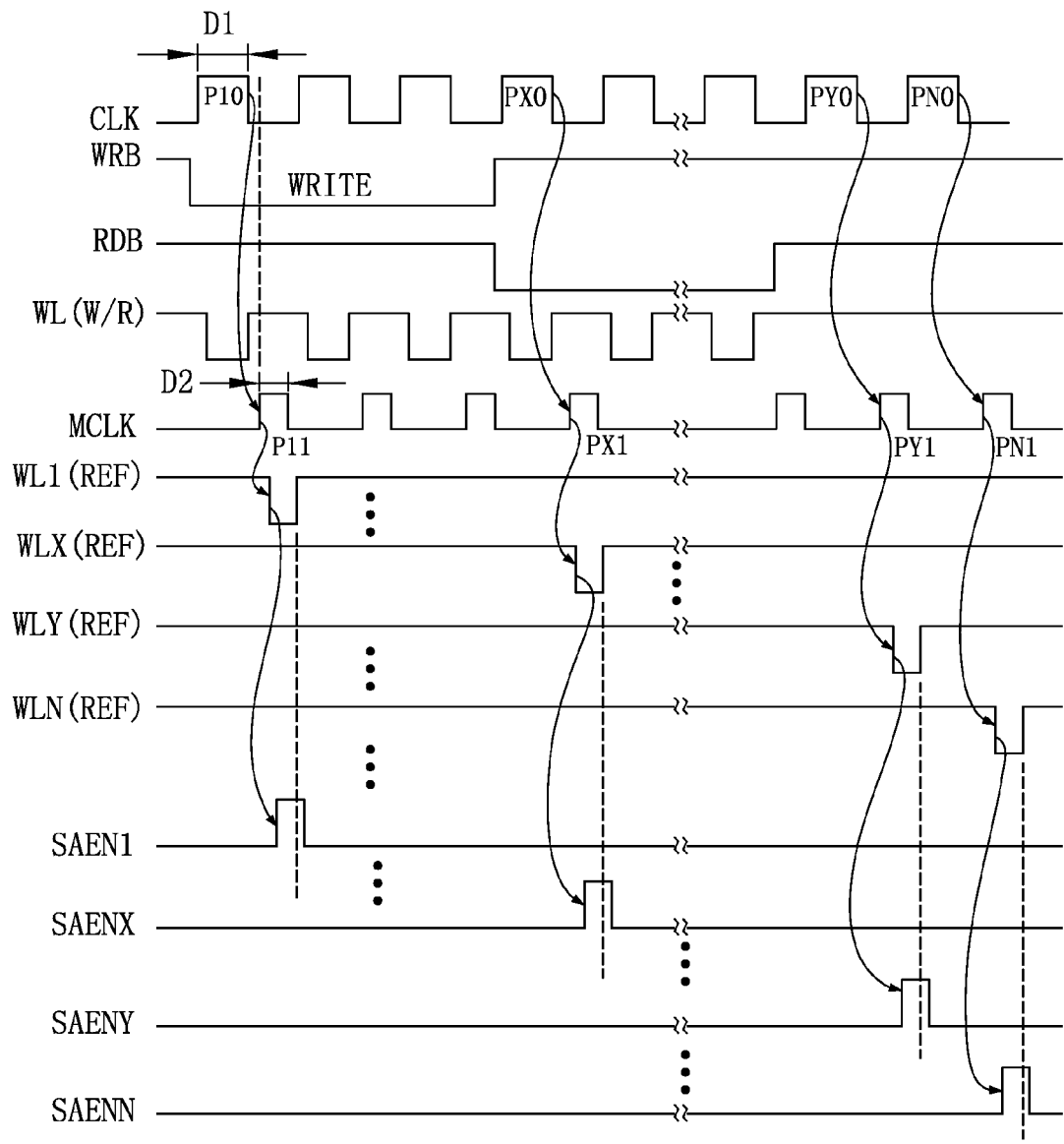
FIG. 2 is a timing diagram associated with a refresh method in accordance with an exemplary embodiment of the 4T memory cell of pseudo SRAM in FIG. 1.

FIG. 2 is a timing diagram associated with a refresh method in accordance with an exemplary embodiment of the 4T memory cell of the pseudo SRAM in FIG. 1. In FIG. 2, a refresh clock signal MCLK is generated subjected to the control of a system clock signal CLK received by the pseudo SRAM. In the illustrated embodiment, the refresh clock signal MCLK includes periodically-generated refresh clock pulses e.g., P11, PX1, PY1 and PN1. Each of the refresh clock pulses P11, PX1, PY1 and PN1 is triggered by an ending edge (e.g., the falling edge) of a corresponding system clock pulse e.g., P10, PX0, PY0 or PN0 of the system clock signal CLK, so that the duty-on period D2 of every clock cycle of the refresh clock signal MCLK is non-overlapped with the duty-on period D1 of any clock cycle of the system clock signal CLK. Herein, the duty-on period D1 is adapted for activating a word line WL to perform a data access operation such as write operation or read operation, and the duty-on period D2 is adapted for activating a word line WL to perform a refresh operation. Moreover, refresh control pulses e.g., WL1(REF), WLX(REF), WLY(REF) and WLN(REF) are respectively triggered by starting edges of the periodically-generated refresh clock pulses P11, PX1, PY1 and PN1 to activate word lines in some order for performing refresh operations. In addition, sense amplifier enable signals e.g., SAEN1, SAENX, SAENY and SAENN are triggered by starting edges of the respective refresh control pulses WL1(REF), WLX (REF), WLY(REF) and WLN(REF) to activate sense amplifiers in the same order as that of the refresh control pulses WL1(REF), WLX(REF), WLY(REF) and WLN(REF) to activate the word lines. An ending edge of each of the refresh control pulses e.g., WL1(REF), WLX(REF), WLY(REF) and WLN(REF) is prior to an ending edge of one of the sense amplifier enable signals e.g., SAEN1, SAENX, SAENY and SAENN triggered by the refresh control pulse. For example, the ending edge of the refresh control pulse WLN(REF) is prior to the ending edge of the sense amplifier enable signal SAENN triggered by the refresh control pulse WLN(REF).

In the following, a refresh operation according to the disclosure performed immediately following a data access operation such as write operation or read operation will be described in detail with reference to FIGS. 1 and 2. Herein, a word line WL is activated by the word line enable signal WL(W/R) once is defined as one data access operation.

In the situation of refresh operation being performed immediately following write operation, a write enable signal WRB (i.e., generally a type of data access enable signal) is at enabled state, e.g., logic "0". Herein, the system clock pulse P10 is taken as an example for the convenience of description, the duty-on period D1 of the system clock signal CLK is identical to the pulse width of the system clock pulse P10, and the duty-on period D2 of the refresh clock signal MCLK is identical to the pulse width of the refresh clock pulse P11. Specifically, in the system clock pulse P10, the word line enable signal WR(W/R) changes to be logic "0" and maintains at logic "0" for a certain time. A word line WL is enabled, data e.g., (1, 0) or (0, 1) prepared on the pair of bit lines BL/BL' would be written into the 4T memory cell and stored by the storage transistors M1, M2. After the write operation, when the ending edge of the system clock pulse P10 comes, the refresh clock pulse P11 of the refresh clock signal MCLK is triggered and thus the starting edge of the triggered refresh clock pulse P11 is slightly posterior to the ending edge of the system clock pulse P10. Subsequently, the starting edge of the triggered refresh clock pulse P11 triggers a corresponding refresh control pulse WL1(REF), so that the same word line WL or another word line WL is enabled for a short time, and data stored by the storage transistors M1, M2 would be read out to the pair of bit lines BL/BL'. Furthermore, since a sense amplifier enable signal SAEN1 is triggered by the starting edge of the refresh control pulse WL1(REF) as the sense amplifier enable signal SAENm in FIG. 1 to activate the inverters Inv1, Inv2 in a corresponding sense amplifier SA for leakage current compensation, and the compensated data on the pair of bit lines BL/BL' then are written back to the 4T memory cell to complete the refresh operation. It is indicated that other refresh operations immediately following the respective write operations during the write enable signal WRB is logic "0" can refer to the above-described refresh operation, and thus will not be repeated herein.

In the situation of refresh operation being performed immediately following read operation, a read enable signal RDB (i.e., generally another type of data access enable signal) is at enabled state, e.g., logic "0". Herein, the system clock pulse PX0 is taken as an example for the convenience of description, the duty-on period D1 of the system clock signal CLK is identical to the pulse width of the system clock pulse PX0, and the duty-on period D2 of the refresh clock signal MCLK is identical to the pulse width of the refresh clock pulse PX1. Specifically, in the system clock pulse PX0, the word line enable signal WR(W/R) changes to be logic "0" and maintains at logic "0" for a certain time. A word line WL is enabled, data e.g., (1, 0) or (0, 1) stored by the storage transistors M1, M2 would be read out to the pair of bit lines BL/BL' from the 4T memory cell, the data on the pair of bit lines BL/BL' then would be delivered to a corresponding enabled sense amplifier SA and outputted to a data input/output circuit (not shown). After the read operation, when the ending edge of the system clock pulse PX0 comes, the refresh clock pulse PX1 of the refresh clock signal MCLK is triggered and thus the starting edge of the triggered refresh clock pulse PX1 is slightly posterior to the ending edge of the system clock pulse PX0. Subsequently, the starting edge of the triggered refresh clock pulse PX1 triggers a corresponding refresh control pulse WLX(REF), so that the same word line WL or another word line WL is enabled for a short time, and data stored by the storage transistors M1, M2 would be read out to the pair of bit lines BL/BL'. Furthermore, since a sense amplifier enable signal SAENX is triggered by the starting edge of the refresh control pulse WLX(REF) as the sense amplifier enable signal SAENm in FIG. 1 to activate the inverters Inv1, Inv2 in a corresponding sense amplifier SA for leakage current compensation, and the compensated data on the pair of bit lines BL/BL' then are written back to the 4T memory cell to complete the refresh operation. It is indicated that other refresh operations immediately following the respective read operations during the read enable signal RDB is logic "0" can refer to the above-described refresh operation, and thus will not be repeated herein.

In addition, during the write enable signal WRB and the read enable signal RDB both are at disabled state, e.g., logic "1", data access operations such as write operation and read operation are disabled, while the refresh operation can be normally performed. In particular, the system clock pulse PY0 is taken as an example for the convenience of description, the duty-on period D1 of the system clock signal CLK is identical to the pulse width of the system clock pulse PY0, and the duty-on period D2 of the refresh clock signal MCLK is identical to the pulse width of the refresh clock pulse PY1. When the ending edge of the system clock pulse PY0 comes, the refresh clock pulse PY1 of the refresh clock signal MCLK is triggered and thus the starting edge of the triggered refresh clock pulse PY1 is slightly posterior to the ending edge of the system clock pulse PY0. Subsequently, the starting edge of the triggered refresh clock pulse PY1 triggers a corresponding refresh control pulse WLY(REF), so that a word line WL is enabled for a short time, and data stored by the storage transistors M1, M2 would be read out to the pair of bit lines BL/BL'. Furthermore, since a sense amplifier enable signal SAENY is triggered by the starting edge of the refresh control pulse WLY(REF) as the sense amplifier enable signal SAENm in FIG. 1 to activate the inverters Inv1, Inv2 in a corresponding sense amplifier SA for leakage current compensation, and the compensated data on the pair of bit lines BL/BL' then are written back to the 4T memory cell to complete the refresh operation. It is indicated that other refresh operations performed during both the write enable signal WRB and the read enable signal RDB being at disabled state can refer to the above-described refresh operation, and thus will not be repeated herein.

Sum up, in the above described embodiments, regardless of the write enable signal WRB and the read enable signal RDB whether are at enabled states (e.g., to be logic "0"), every refresh clock pulse of the refresh clock signal MCLK is non-overlapped with any system clock pulse of the system clock signal CLK, i.e., the duty-on period D2 of the refresh clock signal MCLK is non-overlapped with the duty-on period D1 of the system clock signal CLK, so that the refresh operation can be hidden in every clock cycle of the system clock signal CLK so as to faithfully emulate an SRAM-type interface and thus could operate without interfere the normal data access operation such as write or read operation.

In addition, owing to the refresh operation is performed independent from the data access operation, a word line being activated to perform a data access operation may be different from a word line being activated to perform a refresh operation immediately following the data access operation, and further the refresh operation can be performed by the triggering of periodically-generated refresh clock pulses in row by row manner to prevent data loss.

While the disclosure has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A hidden refresh method for a pseudo SRAM, comprising:
    receiving a system clock signal, wherein a duty-on period of the system clock signal is adapted for performing a data access operation;
    generating a refresh clock signal subjected to the control of the system clock signal, wherein a duty-on period of the refresh clock signal is non-overlapped with the duty-on period of the system clock signal; and
    triggering a refresh control pulse by a starting edge of the duty-on period of the refresh clock signal to activate a word line, for performing a refresh operation.

2. The hidden refresh method as claimed in claim 1, further comprising:
    triggering a sense amplifier enable pulse by a starting edge of the refresh control pulse to activate a sense amplifier, for performing the refresh operation.

3. The hidden refresh method as claimed in claim 2, wherein the ending edge of the refresh control pulse is prior to the ending edge of the sense amplifier enable pulse.

4. The hidden refresh method as claimed in claim 2, wherein the pseudo SRAM comprises a four-transistor (4T) memory cell.

5. The hidden refresh method as claimed in claim 4, wherein the 4T memory cell comprises four PMOS transistors, two PMOS transistors of the four PMOS transistors serve as access transistors, the other two PMOS transistors of the four PMOS transistors serve as storage transistors, gates of the access transistors are electrically coupled to the word line, and sources of the access transistors are respectively electrically coupled to a pair of bit lines, gates of the storage transistors are electrically coupled to a negative source voltage, a drain and a source of one of the storage transistors both are electrically coupled to a drain of one of the access transistors, and a drain and a source of the other one of the storage transistors both are electrically coupled to a drain of the other one of the access transistors.

6. The hidden refresh method as claimed in claim 5, wherein the one of the storage transistors and the one of the access transistors are arranged in twin manner with respect to the other one of the storage transistors and the other one of the access transistors.

7. The hidden refresh method as claimed in claim 4, wherein the pair of bit lines are electrically coupled to the sense amplifier.

8. The hidden refresh method as claimed in claim 7, wherein the sense amplifier comprises a pair of inverters.

9. The hidden refresh method as claimed in claim 4, wherein the 4T memory cell comprises four NMOS transistors.

10. The hidden refresh method as claimed in claim 4, wherein the 4T memory cell is formed by PMOS transistors and NMOS transistors.

11. An operating method for a pseudo SRAM, comprising:
    activating a first word line subjected to the control of a system clock signal cooperative with a data access enable signal to perform a data access operation;
    generating a refresh clock pulse non-overlapping with any clock pulse of the system clock signal, immediately following the data access operation;
    triggering a first refresh control pulse by a starting edge of the refresh clock pulse to activate a second word line, for performing a refresh operation; and
    generating a second refresh control pulse after the starting edge of the first refresh control pulse to activate a sense amplifier, for performing the refresh operation.

12. The operating method as claimed in claim 11, wherein the generating of the refresh clock pulse is triggered by an ending edge of a clock pulse of the system clock signal.

13. The operating method as claimed in claim 11, wherein the generating of the second refresh control pulse is triggered by the starting edge of the first refresh control pulse.

14. A hidden refresh method for a pseudo SRAM, comprising:

periodically generating a refresh clock pulse triggered by an ending edge of a duty-on period of a system clock signal; and performing a refresh operation row by row subjected to an enabling of a word line by the triggering of the periodically-generated refresh clock pulses.

15. The hidden refresh method as claimed in claim 14, wherein the pseudo SRAM comprises a four-transistor (4T) memory cell.

16. The hidden refresh method as claimed in claim 15, wherein the 4T memory cell comprises four PMOS transistors, two PMOS transistors of the four PMOS transistors serve as access transistors, the other two PMOS transistors of the four PMOS transistors serve as storage transistors, gates of the access transistors are electrically coupled to the word line, and sources of the access transistors are respectively electrically coupled to a pair of bit lines, gates of the storage transistors are electrically coupled to a negative source voltage, a drain and a source of one of the storage transistors both are electrically coupled to a drain of one of the access transistors, and a drain and a source of the other one of the storage transistors both are electrically coupled to a drain of the other one of the access transistors.

17. The hidden refresh method as claimed in claim 16, wherein the one of the storage transistors and the one of the access transistors are arranged in twin manner with respect to the other one of the storage transistors and the other one of the access transistors.

18. The hidden refresh method as claimed in claim 16, wherein the pair of bit lines are electrically coupled to a sense amplifier.

19. The hidden refresh method as claimed in claim 15, wherein the 4T memory cell comprises four NMOS transistors.

20. The hidden refresh method as claimed in claim 15, wherein the 4T memory cell is formed by PMOS transistors and NMOS transistors.

* * * * *